United States Patent [19]

Bouley et al.

[11] Patent Number: 4,802,187
[45] Date of Patent: Jan. 31, 1989

[54] DISTRIBUTED FEEDBACK SEMICONDUCTOR LASER OF CONTINUOUSLY TUNABLE WAVELENGTH

[76] Inventors: Jean-Claude Bouley, 35 Avenue du Docteur Durand, 94110 Arcueil; Pascal Correc, 3 Villa d'Alésia, 75014 Paris, both of France

[21] Appl. No.: 46,934

[22] Filed: May 5, 1987

[30] Foreign Application Priority Data

May 16, 1986 [FR] France ............... 86 07064

[51] Int. Cl.$^4$ .............................. H01S 3/19
[52] U.S. Cl. ........................ 372/96; 372/20; 372/46; 372/50
[58] Field of Search ............ 372/50, 96, 46, 20, 372/26, 45

[56] References Cited

U.S. PATENT DOCUMENTS 4,726,031  2/1988  Wakao et al. ............... 372/96

FOREIGN PATENT DOCUMENTS 0169567  1/1986  European Pat. Off. .
2106706  4/1983  United Kingdom .

OTHER PUBLICATIONS

Patent Abstract of Japan, vol. 7, No. 174 (E-190-1319) 2.8.83 and JP-A-58-78488 (Kokusia Denshi Denwa K.K.).
Electronics Letters, vol. 20, No. 23, Nov. 1984, pp. 957–959, Staines, Middlesex, G.B.; L. D. Westbrook et al.
Patent Abstract of Japan, vol. 9, 201 (E-336-1924), 17.8.85 and JP-A-60-66490 (Nippon Denki K.K.).
Electronics Letters, vol. 21, No. 2, 17.1.1985, pp. 63–65, Staines, Middlesex, G.B., M. Yamaguchi et al.
Electronics Letters, vol. 20, No. 24, 22.11.1984, pp. 1016–1018, Staines, Middlesex, G. B., H. Soda et al.

Primary Examiner—James W. Davie
Attorney, Agent, or Firm—Pearne, Gordon, McCoy & Granger

[57] ABSTRACT

A distributed feedback semiconductor laser comprising a substrate and, on such substrate, a double heterostructure formed by a confinement layer, an active layer, a guiding layer engraved to form a diffraction network, the active layer and the guiding layer being engraved to form a ribbon having a certain width and a certain thickness and a central portion of larger width and thickness, a metal electrode surmounting the assembly and enabling charges to be injected through the ribbon, wherein the metal electrode comprises two distinct portions forming a first electrode disposed above the central widened or thickened portion of the ribbon, the first electrode being connected to a first connection for the injection of a first current and a second electrode disposed above the rest of the ribbon and connected to a second connection for the injection of a second current.

6 Claims, 4 Drawing Sheets

DISTRIBUTED FEEDBACK SEMICONDUCTOR LASER OF CONTINUOUSLY TUNABLE WAVELENGTH

The invention relates to a distributed feedback semiconductor laser of continuously tunable wavelenth.

BACKGROUND OF THE INVENTION

Recent progress achieved in the field of semiconductor lasers opens up advantageous prospects for future transmission systems by using optical fibers. The good monochromaticity of distributed feedback lasers (DFB for short) enables the capacity of connections to be considerably enhanced by transmitting several wavelength on the same fiber by optical multiplexing. The distance between the repeaters can also be increased by using the coherent detection technique. This is of course a technique in which the light transmitted by the optical fiber is combined on the same detector with the light originating from a laser of the same wavelength known as a "local oscillator".

However, one of the crucial problems raised by these applications is the wavelength dispersion of the lasers originating from the same semiconductor plate or two different plates. The dispersions observed up to date on DFB lasers are several tens of Angströms (20 and 30). Filtering operations are therefore necessary to make the emission wavelength of the source coincide with that of the optical multiplexers or demultiplexers, or else to make the wavelength of the source coincide with that of the local oscillator for coherent systems.

SUMMARY OF THE INVENTION

It is an object of the invention to provide a solution to this problem by proposing a laser whose wavelength can be electronically tuned over a range of several tens of Angströms. Secondarily, the invention enables a modulation of the optical frequency of emission to be obtained.

To understand the invention properly, it will be useful to recall the essential nature of a DFB laser, even though these structures are well-known nowadays.

FIG. 1 shows such a distributed feedback structure in a variant known as the buried ribbon. It is a Japanese construction of the NEC Corporation disclosed in a paper entitled: "Low threshold and high temperature single longitudinal mode operation of 1.55 $\mu$m - Band DFB-DC-PBH-LD's" by M. Kitamura et al., published in Electronics Letters, July 5, 1984, 20, pp. 596–597.

The structure comprises a substrate 10 of n-doped InP, an active layer 12 of InGaAsP, a guiding layer 14 of InGaAsP, a confinement layer 16 of P-doped InP, a layer 18 of p-doped InP, a layer 20 of n-doped InP, a layer 22 of p-doped InP and a contact layer 24 of p-doped InGaAsP.

The distributed feedback structure itself comprises a holographic network 28 of the first or second order (0.24 or 0.48 $\mu$m in pitch) engraved in the guide formed by the layer 14 disposed just above the active layer 12, which operates at a wavelength of 1.55 $\mu$m. The electronic confinement of the lines of current in the ribbon is obtained using p and n type layers in the form of crescents 26 disposed on either side of the active zone 12 of the laser.

Another structure is known from the publication of J. C. Bouley et al., entitled: "1.55 $\mu$m strip buried Schottky Laser" in "proceedings of the 9th IEEE International Semiconductor Laser Conference", Aug. 7–10, 1984. This structure is shown in FIG. 2. It comprises a substrate 30 of n+-doped InP, a confinement layer 32 of n-doped InP, a ribbon about 2 $\mu$m in width formed by an active layer 34 of GaInAsP and a guiding layer 35 of GaInAsP, the ribbon being buried in a layer 36 of p-doped InP; the layer is covered with a mesa-formed GaInAs layer 38 about 5 $\mu$m in width. The assembly is covered by a layer of titanium 40 and gold 42.

The DFB structure is obtained by engraving a holographic network in the layer 35 operating at 1.3 $\mu$m, and then by repeating epitaxy, taking care to redissolve neither the network nor the ribbon. The wavelength of emission of a DFB laser is very close to the Bragg wavelength ($\lambda_B$) fixed by the pitch of the network P and the effective index n of light in the active layer of the laser ($\lambda_B = (2n)(P)$, second order). In fact, theory and experience show that the laser oscillation takes place on one side or the other of $\lambda$hd B at wave lengths $\lambda_B + \Delta\lambda$ or $\lambda_B - \Delta\lambda$, as shown in FIG. 3, the interval $2\Delta\lambda$ corresponding approximately to the length of the filter formed by the network. It can also be shown by calculation and experimentally checked that emission takes place at $\lambda_B + \Delta\lambda$ or $\lambda_B - \Delta\lambda$ in dependence on the position of the mirrors split in relation to the period of the network. This lack of determination is moreover one of the main causes of the aforementioned wavelength dispersion. It is added to those which result from the fluctuations in effective index caused by heterogeneities and the thickness of the layers and the length of the active portion of the laser.

The conventional DFB structure was recently modified so as to obtain a laser oscillation only at the Bragg wavelength. One of the examples of these new structures was described by H. Soda et al. in the journal Electronics Letters of Nov. 22, 1984, vol. 20, page 1017. The structure is shown in FIG. 4. It comprises a substrate 50 of n-type InP, a GaInAsP guide layer 52 of n-type, such layer being engraved in a network, an active layer 54 of GaInAsP, an InP layer 56 of p type, a contact layer 58 of GaInAsP, a layer 60 of InP burying the active layer, a layer of n-type InP, and finally an electrode 64 covering the whole.

The ribbon formed by the active layer, the guide layer and the confinement layer comprises a central portion 66 widened in relation to the rest of the ribbon. The length of the widened portion is L.

The speed of propagation of the light wave in the ribbon depends on the effective index n, which is modified by an amount $\Delta n$ by the widening of the ribbon. In the widened portion it is shown that the direct wave and the wave diffracted by the network are dephased in relation to one another by a quantity $\Delta\beta$ equal to $(2\pi/\lambda_B)(\Delta n)$. Out of the whole of the section of length L the dephasing is equal to $(\Delta\beta)(a)$.

In the structure of H. Soda et al., the length L is so selected that the dephasing is equal to $\pi/2$. H. Soda et al. obtained these conditions for a widening of the ribbon by 2 to 3 $\mu$m and a length L equal to 60 $\mu$m.

Other structures have also been proposed to obtain the same result, in which, instead of widening the ribbon over a distance L, it is the thickness of the guides which is modified over an equivalent distance, as described by F. Koyama et al. in Electronics Letters, May 10, 1984, vol. 20, no. 10, p. 391. A spatial dephasing can also be created of $\lambda/4$ (2nd order) between the lines of the network at a point substantially centered in the middle of the cavity, as described by K. Sekartedjo et al. in Electronics Letters, Jan. 19, 1984, vol. 20, no. 2, p. 80.

Although these lasers represent progress in the sense that they enable a wavelength to be obtained which is adjusted to the Bragg wavelength, they nevertheless have dispersions due to the heterogeneities which inevitably exist in the structure. Moreover, the lasers clearly cannot be controlled in wavelength, which is fixed by construction. They are therefore not very suitable for systems requiring high precision wavelength.

The invention relates to a DFB struture in which continuous electronic control of the emission wavelength is possible over a range which may reach several tens of Angströms (30 to 50). The disadvantages of the prior art are therefore obviated.

This result is obtained by separating the injection electrode of the charges into two electrodes, a first electrode disposed above the widened or thickened central zone and a second disposed on the remainder of the ribbon. In this way the current injected into the widened central zone is independent of that injected into the remainder of the structure. It can therefore be regulated as required to adjust the dephasing to a desired value and to give the wavelength any value lying between $\lambda_B - \Delta\lambda$ and $\lambda_B + \Delta\lambda$.

BRIEF DESCRIPTION OF THE DRAWINGS

In any case the invention will be better understood from the following description of explanatory, non-limitative embodiments thereof, with reference to the accompanying drawings, wherein.

DETAILED DESCRIPTION OF THE PREFERRED EMBODIMENTS

Figure 1:
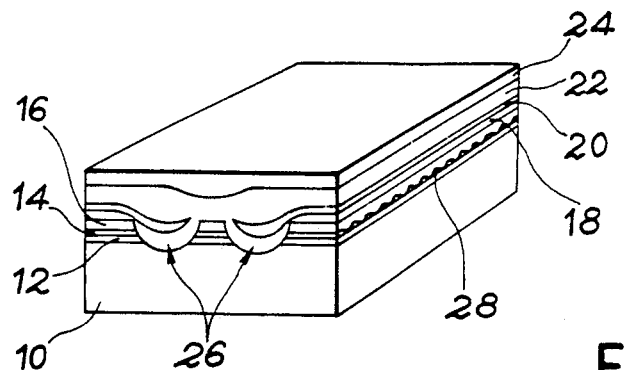
FIG. 1, already described, shows a distributed feedback structure with a buried ribbon, FIG. 2, already described, represents another structure of the kind, FIG. 3, already described, is a diagram showing the range of oscillation of a distributed feedback laser, FIG. 4, already described, shows a prior art structure comprising a ribbon with a widened central zone.
Figure 2:
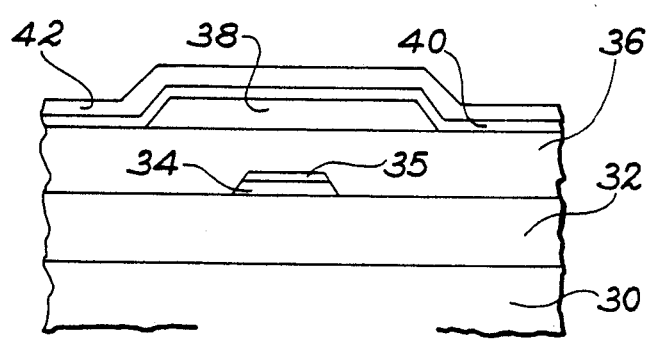
Figure 3:
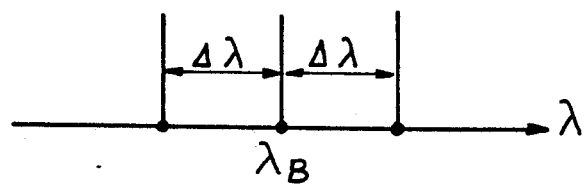
Figure 4:
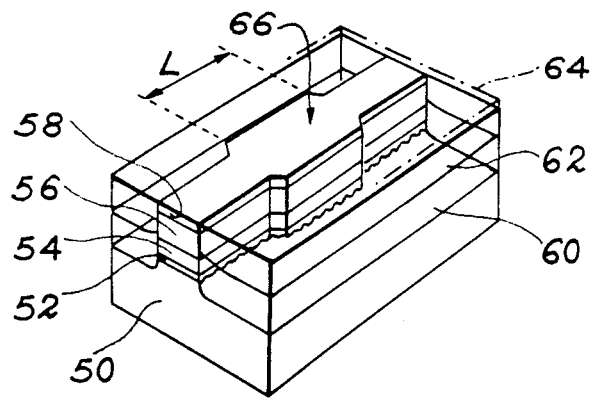
Figure 5:
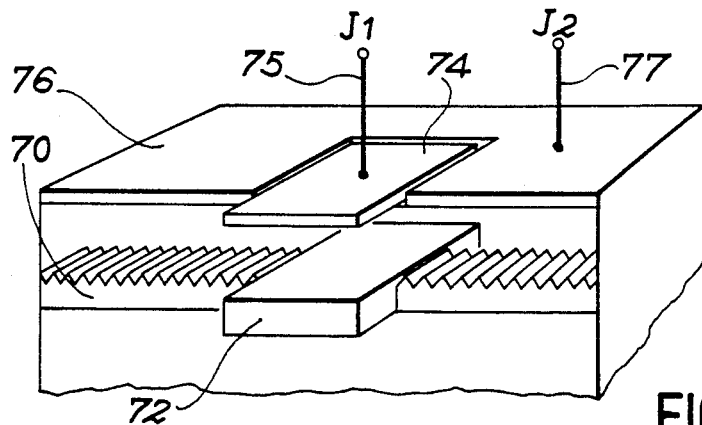
FIG. 5 shows diagrammatically a structure according to the invention.

The structure shown in FIG. 5 is diagrammatic in the sense that the various active, confinement or contact layers are not shown explicitly. Only the guiding layer 70 is shown, with its widened central portion 72 acting as a dephasing section. The complete structure will be illustrated in FIG. 9. The originality of the laser in FIG. 5 resides in the division of the upper electrode into a central portion 74 connected to a connection 75 carrying a current $J_1$ and a portion 76 enclosing the central portions 74 and connected to a connection 77 carrying a current $J_2$.

Figure 6:
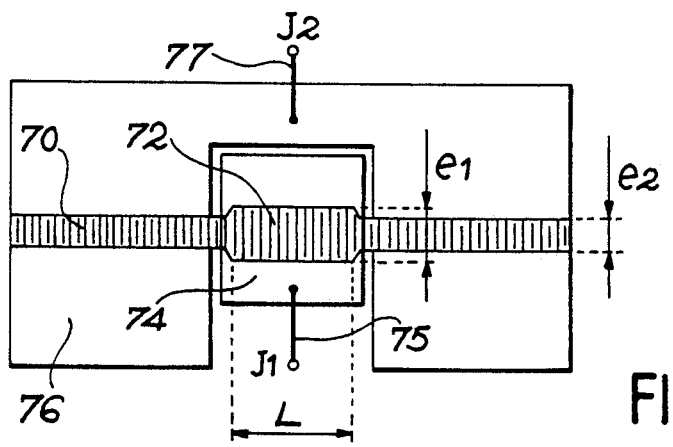
FIG. 6 is a diagrammatic plan view of a structure according to the invention.

FIG. 6 is a plan view of the same structure.

It will be observed that the widened central portion 72, which introduces the dephasing, can be engraved in a diffraction network like the rest of the ribbon (FIG. 6) or not engraved (FIG. 5).

The invention can also be applied to the aforedescribed structure of F. Koyama et al.; one of the electrodes will then be disposed above the central zone having a thickened guide, the other electrode covering the rest of the ribbon.

The structure operates as follows. In the central zone the effective index has the value $n_0$ and in the rest of the engraved ribbon the value $n_1$. If L is the length of the central zone, a dephasing B is obtained which has the value $(n_0 - n_1)(L)(2\pi/\lambda)$. Three cases may occur:

(a) - when the value of the current $J_1$ injected into the dephaser corresponding to the central zone increases, the effective index $n_0$ diminishes by the quantity $\Delta n_0$, equal to $-(\partial n_a/\partial N)(\Gamma)(\Delta N)$ where $\partial n_a/\partial N$ is the known law of variation of the refractive index of the active layer with a number of carriers injected, $\Gamma$ is the optical confinement factor and $\Delta N$ the number of carriers injected into the active zone (in the first approximation, $\Delta N$ can be calculated by the expression $\Delta N = \Delta J_1/\sqrt{2(J_1)(q)(d)(B)}$, where q is the charge of the electron, B the probability of recombination, d the thickness of the active region. The dephasing may therefore tend towards 0 and the emission wavelength of the laser can be shifted towards $\lambda_B + \Delta\lambda$.

Moreover, having regard to the surplus gain induced into the dephaser, the current $J_2$ to be injected into the rest of the structure clearly diminishes.

(b) - Conversely, a reduction in the current $J_1$ causes an increase in the effective index of the dephaser and therefore, in accordance with the relation given above, an increase in dephasing. A very simple calculation with the above relations shows that the dephasing can tend towards $\pi$ and that, therefore, the wavelength can be shifted to $\lambda_B - \Delta\lambda$. On the other hand, the reduction of gain in the dephaser would induce an increase in the threshold current.

(c) - If the current $J_1$ is equal to the current $J_2$, there is uniform injection throughout the structure and therefore the situation in the prior art, with the structure described by H. Soda et al. In that case the dephasing is equal to $\pi/2$ (since the length L is selected for the dephasing to have this value in the case of homogeneous injection). The wavelength of emission is then equal to the Bragg wavelength $\lambda_B$.

Figure 7:
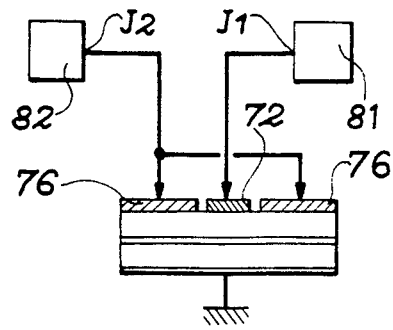
FIG. 7 is an equivalent electric circuit showing the injection of charges into the laser according to the invention.

FIG. 7 shows the equivalent circuit of the laser according to the invention with two current generators 81 and 82 delivering two currents $J_1$ and $J_2$.

Figure 8:
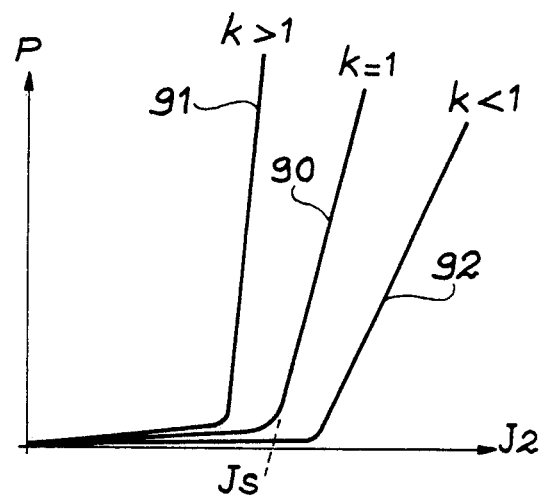
FIG. 8 is a graph showing the variations in optical power emitted as a function of the density of the injected current for different values of the injected current in the central portion.

The graphs in FIG. 8 shows the variations in the light power P emitted by the laser as a function of the current density $J_2$ injected into the ribbon for different values of, the current density $J_1$ injected into the central dephasing zone. If we denote by $J_S$ the threshold current density corresponding to uniform injection, we may note $J_1 = kJ_S$. We then have three different cases:

if $k=1$, we have $J_1 = J_S$ and emission takes place at $\lambda_B$; this is curve 90 in the graph in FIG. 8, if $k>1$, the wavelength can be tuned up to $\lambda_B + \Delta\lambda$ according to the value of k; we obtain curve 91, if $k<1$, the wavelength can be tuned up to $\lambda_B - \Delta\lambda$; we obtain the curve 92.

Calculation and experiment show that the variations in current $J_1$ required to observe the agreement are a few milliamps (about 5) for a laser with buried ribbon having a threshold current $J_S$ of about 20 milliamps.

The wave length tuning plateau is thus $2\Delta\lambda$, - i.e., the width of the characteristic band of the network (the stopband). The best value published for this band is 39 Angströms. Optimization of the technological parameters of the network (order, form ... ) enable tuning of 50 to 60 Ångstroms to be obtained.

Figure 9:
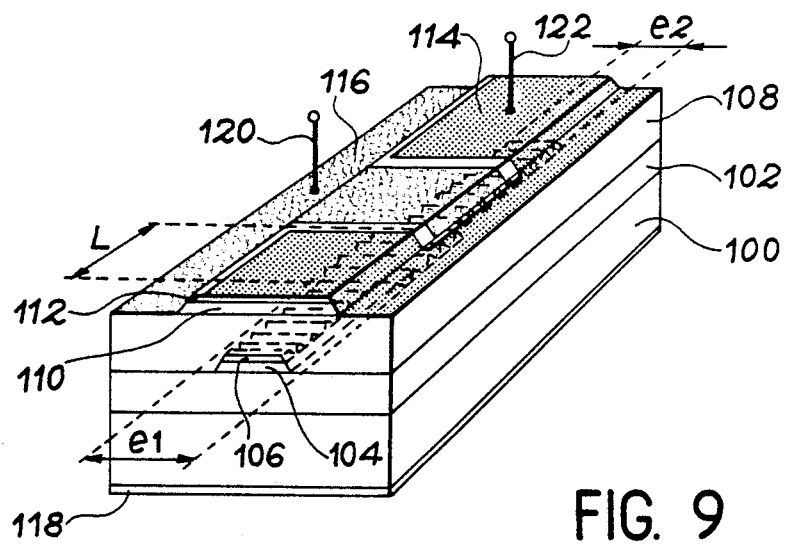
FIG. 9 shows a complete laser according to the invention.
Figure 10:
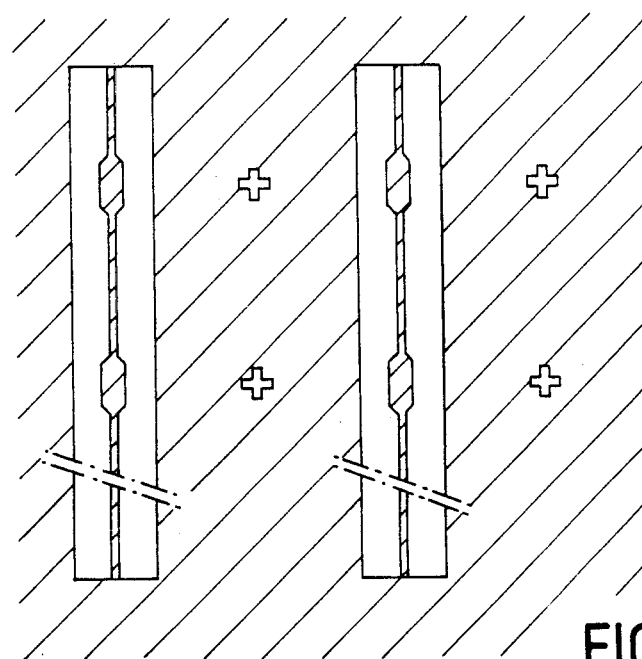
FIG. 10 shows the first mask enabling the widened central portion to be produced.
Figure 11:
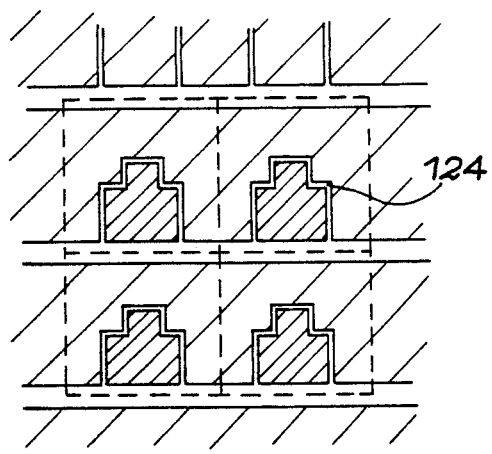
FIG. 11 shows a second mask enabling the electrodes to be engraved.

A variant method of producing the structure according to the invention will now be described. FIG. 9 shows the laser obtained by this process and FIGS. 10 and 11 show two masks used in the process.

The process taken as an example comprises in outline six stages:

1. The formation of a heterostructure by epitaxy in the liquid phase or epitaxy in the vapor phase (OM-CVD); this heterostructure comprises, on a substrate 100 of type n:
   a layer 102 of n-type InP doped between $5 10^{17}$ and $10^{18}$ electrons/cm$^3$, an active layer 104 of GaInAsP of wavelength 1.55 μm or 1.3 μm, depending on the wavelength required for the laser,
   a guide layer 106 of GaInAsP 1.3 μm for a laser 1.5 μm or 1.15 μm for a laser 1.3 μm.

2. The engraving in the layer 106 of a first or second order network by conventional masking and engraving techniques (holographic masking or electronic masking).

3. The chemical or ionic engraving of the network to give it a ribbon shape (motif shown in FIG. 10). The critical dimensions are $e_1$, $e_2$ and L. We can take, for example, $e_1=2$ μm, $e_2=3$ μm and $L=50$ μm. The optimum values lie between 1 and 3 μm for $e_1$, 2–4 μm for $e_2$ and 20–100 μm for L, for a laser of length between 200 and 400 μm.

4. The repetition of epitaxy to form a layer 108 of p-type InP and a layer 110 of P+-type InGaAsP. The most suitable growth technique for this stage is epitaxy in the vapor phase on organometallic substances, since the motifs engraved with the mask in FIG. 10: ribbon, dephaser, centering cross, reappear on the surface after the repetition, thus making it all the easier to realign the contacts.

5. Contacting: after the usual operations of thinning the substrate 100, Au-Ge (118) and Au-Zn (112) contacts are deposited over the whole surface, on the n and p sides of the structure respectively. The contact 112 is then engraved in the form of a ribbon 4 μm in width perpendicularly above the buried ribbon, then interrupted at the central zone by means of the mask (FIG. 11). The mask has a slot 124 separating the two electrodes. In this embodiment the length L must be identical with that of the dephaser (FIG. 10). Then an electrode 114 and an electrode 116 are obtained which are separated from one another.

6. Ti-Au metallization: to facilitate contacting on the Au-Zn ribbon 112 4 μm in width, first of all the contact layer 110 is engraved on either side of the Au-Zn ribbon 112, whereafter a Ti-Au contact 114 is deposited on the Au-Zn ribbon and on the p-InP layer 108 thus disengaged. It is known that the resulting Ti-Au contact allows the confinement of current injected into the ribbon (cf. French Patent Application No. 2 488 049), since it forms an ohmic contact at the center and two Schottky barriers at the edges, in contact with p-type InP.

The final structure is obtained after cleavage and assembly of the laser chip, followed by the welding of two wires 120 and 122 on the two electrodes 116 and 114 deposited on the p-side.

Finally, it should be noted that the idea of electronically controlling the emission wavelength of a DFB laser was already put forward by a number of authors. For example, we may site the paper by M. Kitamura et al. in IEEE, JQE, No. May 21, 1985, pages 415–417. In such a structure the phase of the light wave in relation to the network is connected by the an intra-cavity phase modulator (tuning region). In dependence on the current injected into the zone, it is possible to obtain an emission stable at $\lambda_B+\Delta\lambda$ or at $\lambda_B-\Delta\lambda$, in this way getting rid of the imprecision concerning $\lambda$ resulting from the cleavage of the cavity. The phase modulator is quite simply formed by the laser structure, minus its network. The flow of current in this region changes the propagation index proportionally to the number of carriers injected, thus enabling the optical distance separating the cleaved face and the network to be controlled A similar structure can be used with a region without a network which is used for optical application and a region with a network, which is used for tuning the effective index. This structure enables an intermittent variation in wavelength to be obtained over a plateau of 40 Angströms, with a variation per pitch of 5 Angströms. In fact, it is a structure slightly different from the distributed reaction diode, known as a DBR (distributed Bragg reflector) in which the wavelength selectivity and tuning are obtained by distributing the network feedback outside the cavity.

Such a structure is described, for example, in the paper by M. Yamagushi et al. published in Electronics Letters of Jan. 17, 1985, vol. 21, No. 2, pages 64–65.

The structure according to the invention differs from these devices by the feature that charge injection is performed in a zone lying outside the cavity, in a widened or thickened portion which itself produces a dephasing of geometrical origin, such dephasing being adjusted electronically. In this way, wavelength tuning is continuous and not intermittent as in the prior art. This is a decisive advantage for optical links.

What is claimed is:

1. A distributed feedback semiconductor laser comprising:
    a metal electrode;
    a substrate on said metal electrode;
    a double heterostructure on said substrate formed by
        a confinement layer on said substrate, an active layer on said confinement layer, and a guiding layer engraved to form a diffraction network on said active layer, the active layer and the guiding layer forming a ribbon having a certain width and a certain thickness and a central portion of larger at least one of width and thickness; and
    another metal electrode surmounting the heterostructure enabling charges to be injected through the ribbon, wherein said another metal electrode comprises two distinct portions forming a first electrode disposed above the central portion of the ribbon, the first electrode being connected to a first connection for the injection of a first current and a second electrode disposed above the rest of the ribbon and connected to a second connection for the injection of a second current.

2. A laser according to claim 1, wherein the ribbon is buried in a first epitaxial layer and a second epitaxial layer surmounts a portion of the first epitaxial layer forming a mesa over the ribbon.

3. A laser according to claim 2, wherein a first metal layer surmounts the mesa.

4. A laser according to claim 3, wherein the first and second electrodes are formed by a second metal layer on the first epitaxial layer and the first metal layer, an ohmic contact being formed between the first and second metal layers and a Schottky contact being formed between the second metal layer and the first epitaxial layer.

5. A laser according to claim 1, wherein the central portion is engraved in a diffraction network, like the rest of the ribbon.

6. A ribbon according to claim 1, wherein the central portion is not engraved in a network.

* * * * *